United States Patent
Sharon et al.

(10) Patent No.: US 12,020,751 B2
(45) Date of Patent: Jun. 25, 2024

(54) READ THRESHOLD CALIBRATION FOR CROSS-TEMPERATURE LONG, SEQUENTIAL READS

(71) Applicant: Western Digital Technologies, Inc., San Jose, CA (US)

(72) Inventors: Eran Sharon, Rishon Lezion (IL); Nika Yanuka, Hadera (IL); Idan Alrod, Herzeliya (IL); Alexander Bazarsky, Holon (IL); Evgeny Mekhanik, Rehovot (IL)

(73) Assignee: Western Digital Technologies, Inc., San Jose, CA (US)

(*) Notice: Subject to any disclaimer, the term of this patent is extended or adjusted under 35 U.S.C. 154(b) by 121 days.

(21) Appl. No.: 17/714,379

(22) Filed: Apr. 6, 2022

(65) Prior Publication Data

US 2023/0326528 A1    Oct. 12, 2023

(51) Int. Cl.
| | |
|---|---|
| *G11C 16/04* | (2006.01) |
| *G11C 7/04* | (2006.01) |
| *G11C 16/08* | (2006.01) |
| *G11C 16/10* | (2006.01) |
| *G11C 16/24* | (2006.01) |
| *G11C 16/26* | (2006.01) |

(52) U.S. Cl.
CPC ............. *G11C 16/102* (2013.01); *G11C 7/04* (2013.01); *G11C 16/08* (2013.01); *G11C 16/24* (2013.01); *G11C 16/26* (2013.01); *G11C 2207/2254* (2013.01)

(58) Field of Classification Search
CPC ......... G11C 16/102; G11C 7/04; G11C 16/08; G11C 16/24; G11C 16/26; G11C 2207/2254
USPC .................................................... 365/185.09
See application file for complete search history.

(56) References Cited

U.S. PATENT DOCUMENTS

| | | |
|---|---|---|
| 8,099,652 B1 | 1/2012 | Alrod et al. |
| 9,368,225 B1 | 6/2016 | Pinkovich et al. |
| 2010/0091535 A1 | 4/2010 | Sommer et al. |
| 2010/0131827 A1 | 5/2010 | Sokolov et al. |
| 2011/0258496 A1 | 10/2011 | Tseng et al. |
| 2012/0008386 A1 | 1/2012 | Chilappagari et al. |
| 2012/0213004 A1 | 8/2012 | Yun et al. |
| 2013/0094289 A1 | 4/2013 | Sridharan et al. |
| 2014/0095110 A1 | 4/2014 | Chen et al. |
| 2014/0321204 A1 | 10/2014 | Yang |
| 2016/0041891 A1 | 2/2016 | Malshe et al. |
| 2016/0147582 A1 | 5/2016 | Karakulak et al. |
| 2017/0117053 A1 | 4/2017 | Sharon et al. |
| 2018/0159560 A1 | 6/2018 | Sharon et al. |
| 2018/0374550 A1 | 12/2018 | Barndt et al. |
| 2019/0189202 A1 | 6/2019 | Avraham et al. |

(Continued)

*Primary Examiner* — Tha-O H Bui
(74) *Attorney, Agent, or Firm* — Dickinson Wright PLLC; Steven C. Hurles

(57) ABSTRACT

A system and method for calibrating read threshold voltages includes performing a plurality of read operations, determining to perform a read level tracking method, and performing the read level tracking method. The determining may be based on a temperature change or a bit error rate (BER). The read level tracking method includes determining the BER of an indicative word line, determining an adjusted read threshold level based on the BER, and adjusting read threshold levels according to the adjusted read threshold level.

15 Claims, 14 Drawing Sheets

(56) References Cited

U.S. PATENT DOCUMENTS

2019/0385684 A1 12/2019 Bhatia et al.
2020/0105353 A1* 4/2020 Sharon ................. G11C 29/021

* cited by examiner

If $BER_{1\to 0} > BER_{0\to 1}$, move left

If $BER_{1\to 0} < BER_{0\to 1}$, move right

READ THRESHOLD CALIBRATION FOR CROSS-TEMPERATURE LONG, SEQUENTIAL READS

BACKGROUND

Apparatuses and methods consistent with exemplary embodiments relate to techniques for improving read performance in a memory device.

Requirements for Quality of Service (QoS) have been raised in recent years, dictating a profile of latency/probability that storage device should target. In order to improve QoS, system solutions strive to improve their performance, not only in an average scenario, but for a wide range of different scenarios and command combinations.

The difficulty of maintaining process uniformity, introduced by Not-And (NAND) process shrinking and three-dimensional (3D) stacking, may provide additional difficulties for the maintenance of QoS standards. A lack of process uniformity leads to increased variability among memory dies, blocks, and pages and also across different endurance, retention, temperature and disturbance conditions, for example. Operation under such diverse conditions requires using an adaptive system, especially in terms of tracking optimal read thresholds in order to ensure that the read throughput and input/output operations per second (IOPS) requirements are met and to ensure desired QoS.

Cross-temperature (writing at one temperature and reading at another) influences Flash read thresholds such that read threshold calibration is often needed to read a target word line (WL) with a low bit error rate (BER). This problem is persistent in many embedded storage devices and is very relevant in Internet of Things (IoT) technologies and automotive devices, among others.

During long sequential reads with temperatures shifting during the read, the system is required to adapt to the temperature shift. Read threshold calibration can be conducted through a process of applying a number of senses and then sequentially calculating a Syndrome Weight (SW) as an estimate of the bit error rate (BER) according to different hypotheses related to the number of senses. This process may be referred to as a BER Estimation Scan (BES).

An example BES process uses a low-density parity-check (LDPC) engine for calibrating read threshold levels to reduce the BER. Data programmed into a memory must satisfy a set of parity check constraints. A Syndrome Weight (SW) is the number of unsatisfied parity check constraints, and the SW of a read codeword provides an estimation of its BER. For example, in a memory device programmed according to a QLC (four bits per memory cell) scheme with sixteen (16) possible states, reading a middle page requires doing senses at four different transition points. Around each of these transition points, a few reads are sampled and a combination of read thresholds that minimize the BER are identified.

Alternately, valleys in a Cell Voltage Distribution (CVD) can be determined by measuring the difference of conducting cells between different voltage points in a process referred to as a Valley Search (VS).

Solutions such as BES and VS are high latency operations aimed at optimizing read thresholds for a specific WL, which is good for read recovery flow, but may be less effective for maintaining rapidly shifting read thresholds. It is not feasible for a system to perform BES or VS at high frequency as that would significantly impair performance.

SUMMARY

Example embodiments may address any problems and/or disadvantages and other disadvantages not described above. Also, example embodiments are not required to overcome the disadvantages described above, and may not overcome any of the problems described above.

According to one or more example embodiments, read level tracking (RLT) operations are used to provide a less-accurate, low-latency operation that can only be performed when decoding is successful.

According to an aspect of an example embodiment, a method of calibrating read threshold voltages comprises: performing a plurality of read operations; determining to perform a read level tracking (RLT) method; and performing the RLT method comprising: determining a bit error rate (BER) of an indicative word line (WL); determining an adjusted read threshold level based on the BER; and adjusting read threshold levels according to the adjusted read threshold level.

According to an aspect of another example embodiment, a system for calibrating read threshold voltages comprises a controller in operative communication with at least one memory die, the controller comprising: an interface configured to receive, from the at least one memory die, a number of page bits corresponding to a plurality of read operations; and a processor configured to: determine to perform a read level tracking (RLT) method; and perform the RLT method comprising: determining a bit error rate (BER) of an indicative word line (WL); determining an adjusted read threshold based on the BER; and adjusting read threshold levels according to the adjusted read threshold level.

According to an aspect of another example embodiment, a system for calibrating read threshold values comprises a controlling means in operative communication with at least one memory die, the controlling means comprising: an interface means configured to receive, from the at least one memory die, a number of page bits corresponding to a plurality of read operations; and processing means configured to determine to perform a read level tracking (RLT) method; and to perform the RLT method comprising: determining a bit error rate (BER) of an indicative word line (WL); determining an adjusted read threshold based on the RLT method; and adjusting read threshold levels according to the adjusted read threshold level.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1A:
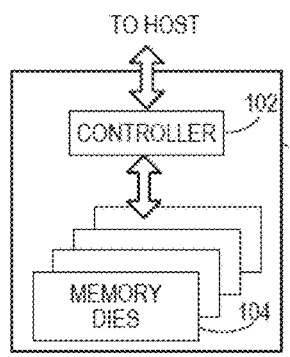
FIG. 1A is a block diagram of an example memory system.

Reference will now be made in detail to example embodiments which are illustrated in the accompanying drawings, wherein like reference numerals refer to like elements throughout. In this regard, the example embodiments may have different forms and should not be construed as being limited to the descriptions set forth herein.

It will be understood that the terms "include," "including", "comprise," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," when preceding a list of elements, modify the entire list of elements and do not modify the individual elements of the list. In addition, the terms such as "unit," "-er (-or)," and "module" described in the specification refer to an element for performing at least one function or operation, and may be implemented in hardware, software, or the combination of hardware and software.

FIG. 1 illustrates a block diagram of a memory system 100 according to an example embodiment which may perform the methods as described herein. The memory system 100 includes a controller 102 and memory that includes one or more memory dies 104. As used herein, the term die refers to the set of memory cells, and associated circuitry for managing the physical operation of those memory cells, that are formed on a single semiconductor substrate. The controller 102 may interface with a host system and transmit command sequences for read, program, and erase operations to the memory dies 104.

The controller 102, which is a flash memory controller, can take the form of any one of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and illustrated in the flow diagrams of the figures described herein. For example, the controller can control read threshold levels in the non-volatile memory. Additionally, or alternatively, some of the components shown as being internal to the controller can also be stored external to the controller, and other components can be used. Additionally, or alternatively, the phrase "in operative communication with" could mean in direct communication with or indirectly (wired or wireless) in communication with through one or more components, which may or may not be illustrated or described herein.

As described herein, the controller 102 is a device that manages data stored in the memory dies and is in communication with the host, such as a computer or electronic device. The controller 102 may have any of various additional functionalities in addition to the specific functionality described herein. For example, the controller 102 may format the memory dies 104 to ensure they operating properly, may map out bad flash memory cells, and may allocate spare cells to be substituted for future failed cells. Some part of the spare cells may be used to hold firmware to operate the controller 102 and implement other features. In operation, when the host needs to read data from or write data to the memory dies 104, the host will communicate with the controller 102. If the host provides a logical address to which data is to be read/written, the controller 102 can convert the logical address received from the host to a physical address in the memory dies 104. Alternately, the host may provide the physical address. The controller 102 may also perform various memory management functions, such as, but not limited to, wear leveling (the distribution of writes to avoid wearing out specific blocks of memory that would otherwise be repeatedly written to) and garbage collection (a process of only the valid pages of data of a full block to a new block, so the full block can be erased and reused). The controller 102 may also control the methods and operations described hereinbelow.

The interface between the controller 102 and the non-volatile memory dies 104 may be any suitable interface, such as a flash interface. The memory system 100 may be a card-based system, such as a secure digital (SD) or a micro secure digital (micro-SD) card. Alternately, the memory system 100 may be part of an embedded memory system.

As shown in FIG. 1A, the memory system 100 is illustrated as including a single channel between the controller 102 and the non-volatile memory dies 104. However, this is not intended to be limiting, and the memory system may include more than a single channel, such as a memory system embodying a NAND architecture and including two, four, eight, or more channels between the controller 402 and the memory dies 104. In any one or more of the example embodiments described herein, multiple channels may exist between the controller 102 and the memory dies 104, even if a single channel is illustrated.

Figure 1B:
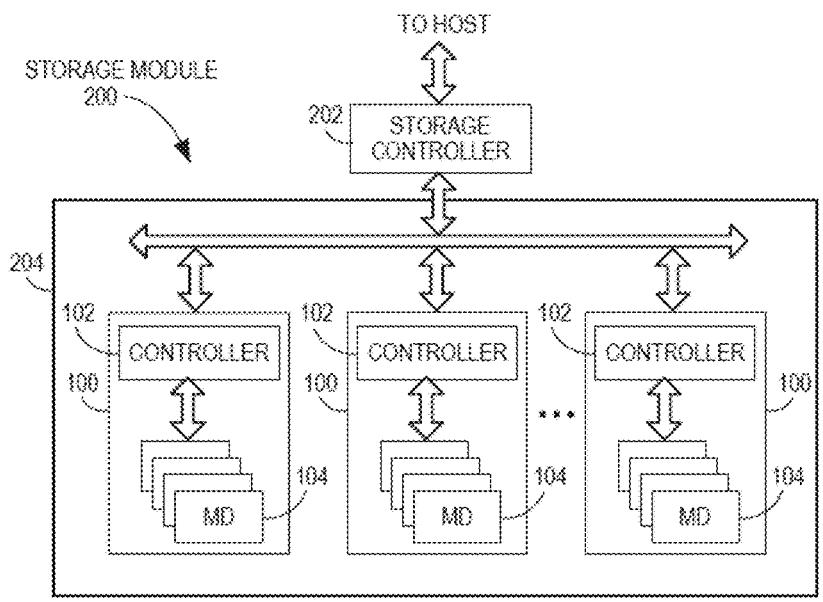
FIG. 1B is a block diagram of an example storage module including a plurality of memory systems.

FIG. 1B is a block diagram of a storage module 200 including a plurality of memory systems according to an example embodiment. As such, the storage module 200 includes a storage controller 202 that interfaces with the host and with a storage system 204, which includes a plurality of non-volatile memory systems 200. The interface between the storage controller 202 and non-volatile memory systems 100 may be a bus interface, such as a serial advanced technology attachment (SATA), a peripheral component interface express (PCIe) interface, an embedded Multimedia Card (eMMC) interface, an SD interface, or a Universal Serial Bus (USB) interface, for example. The storage module 200 may be a solid-state drive (SSD), such as found in portable computing devices, such as laptop and tablet computers and mobile phones.

Figure 1C:
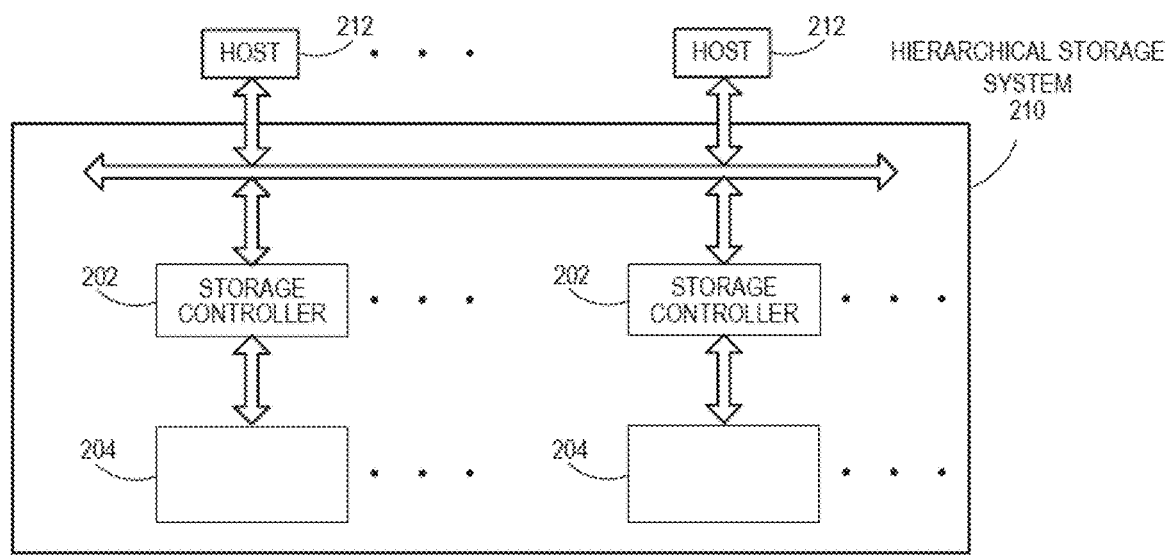
FIG. 1C is a block diagram of an example hierarchical storage system.

FIG. 1C is a block diagram of an example hierarchical storage system 210. The hierarchical storage system 210 includes a plurality of storage controllers 202, each of which controls control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface, for example. The storage system 210 may be a rack-mountable mass storage system that is accessible by multiple host computers, such as would be found in a data center or other location where mass storage is needed.

Figure 2A:
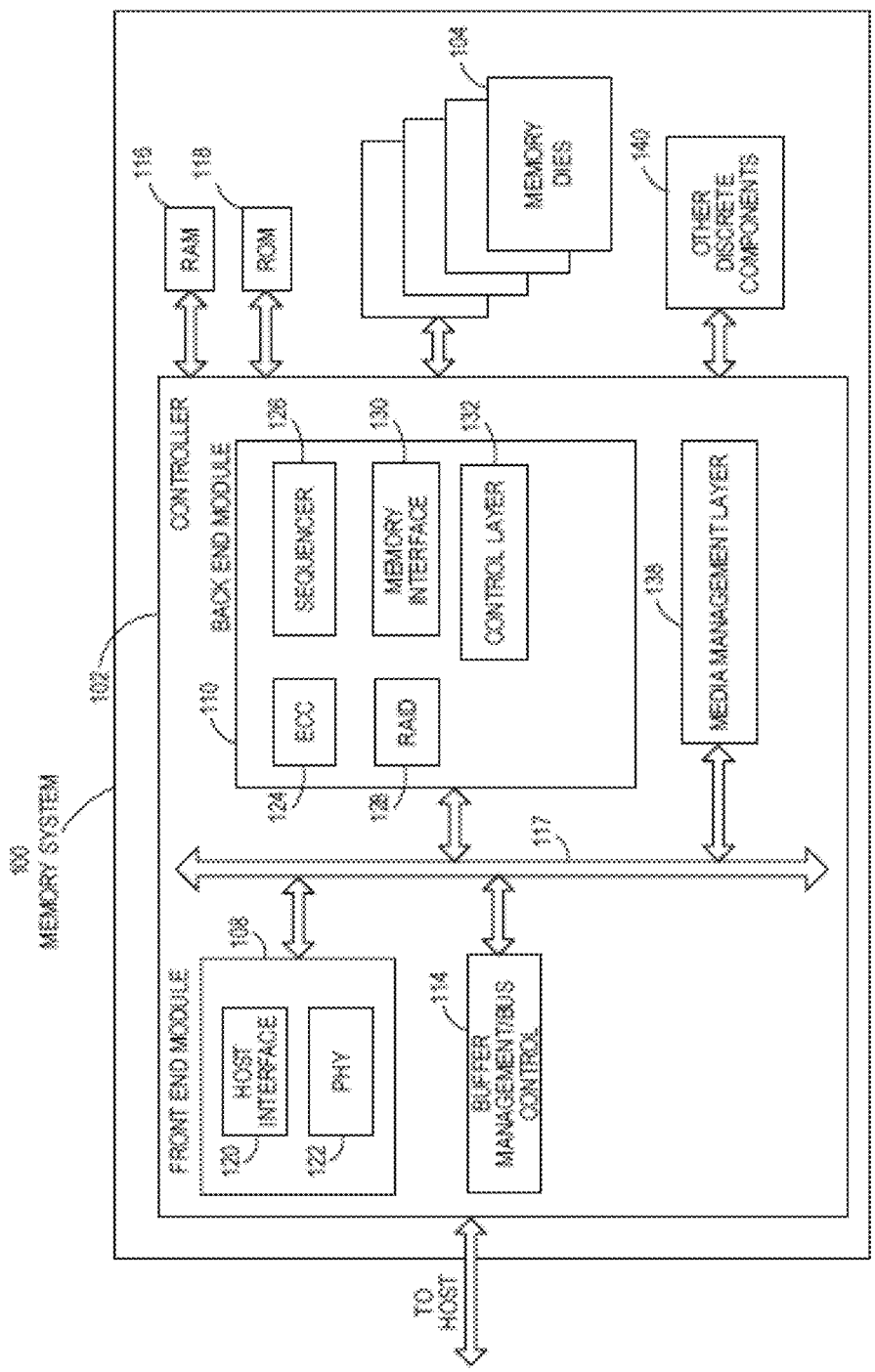
FIG. 2A is a block diagram of an example configuration of components of a controller of the memory system of FIG. 1A.

FIG. 2A is a block diagram of a configuration of components of a controller 102 of the memory system 100 of FIG. 1A. The controller 102 may include a front end module 108 that interfaces with the host, a back end module 110 that interfaces with the non-volatile memory dies 104, and various other modules that perform various functions of the non-volatile memory system 100. As described herein, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or any combination thereof. In addition or alternately, each module may include memory hardware that comprises instructions executable with a processor or processor circuitry to implement one or more of the features of the module. When any one of the modules includes the portion of the memory that comprises instructions executable with the processor, the module may or may not include the processor. In some instances, each module may simply be the portion of the memory that comprises instructions executable with the processor to implement the features of the corresponding module without the module including any other hardware. Because each module includes at least some hardware even when the included hardware includes software, each module may be referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated as located separately from the controller 102, one or both of the RAM 116 and the ROM 118 may be located within the controller 102. According to one or more example embodiments, portions of RAM 116 and ROM 118 may be located both within the controller 102 and outside the controller 102. According to one or more example embodiments, the controller 102, the RAM 116, and the ROM 118 may be located on separate semiconductor dies.

The front-end module 108 may include a host interface 120 and a physical layer interface (PHY) 122 that provide the electrical interface with the host or next level storage controller. The type of the host interface 120 can depend on the type of memory being used. Example types of the host interface 120 may include, but are not limited to, SATA, SATA Express, SAS, Fibre Channel, USB, PCIe, and NVMe. The host interface 120 may facilitate transfer for data, control signals, and timing signals.

The back-end module 110 may include an error correction code (ECC) engine or module 124 that encodes the data bytes received from the host, and decodes and error corrects the data bytes read from the non-volatile memory dies 104. The ECC engine may be a low-density parity-check (LDPC) engine which uses a linear error correcting code. The back end module 110 may also include a command sequencer 126 that generates command sequences, such as program, read, and erase command sequences, to be transmitted to the non-volatile memory dies 104. The back end module 110 may include a RAID (Redundant Array of Independent Drives) module 128 that manages generation of RAID parity and recovery of failed data. The RAID parity may be used as an additional level of integrity protection for the data being written into the non-volatile memory system 100. The RAID module 128 may be a part of the ECC engine 124. A memory interface 130 provides command sequences to the non-volatile memory dies 104 and receives status information from the non-volatile memory dies 104. Along with the command sequences and status information, data to be programmed into and read from the non-volatile memory dies 104 may be communicated through the memory interface 130. According to one or more example embodiments, the memory interface 130 may be a double data rate (DDR) interface and/or a Toggle Mode 200, 400, 800, or higher interface. A control layer 132 may control the overall operation of back end module 110.

Additional modules of the non-volatile memory system 100 may include a media management layer 138 that performs certain memory management functions such as wear leveling of memory cells of the memory dies 104, address management, and facilitation of folding operations. The non-volatile memory system 100 may also include other discrete components 140, such as external electrical interfaces, external RAM, resistors, capacitors, or other components that may interface with the controller 102. According to one or more example embodiments, one or more of the RAID module 128, the media management layer 138, and the buffer management/bus controller 114 are optional components that may be omitted.

Figure 2B:
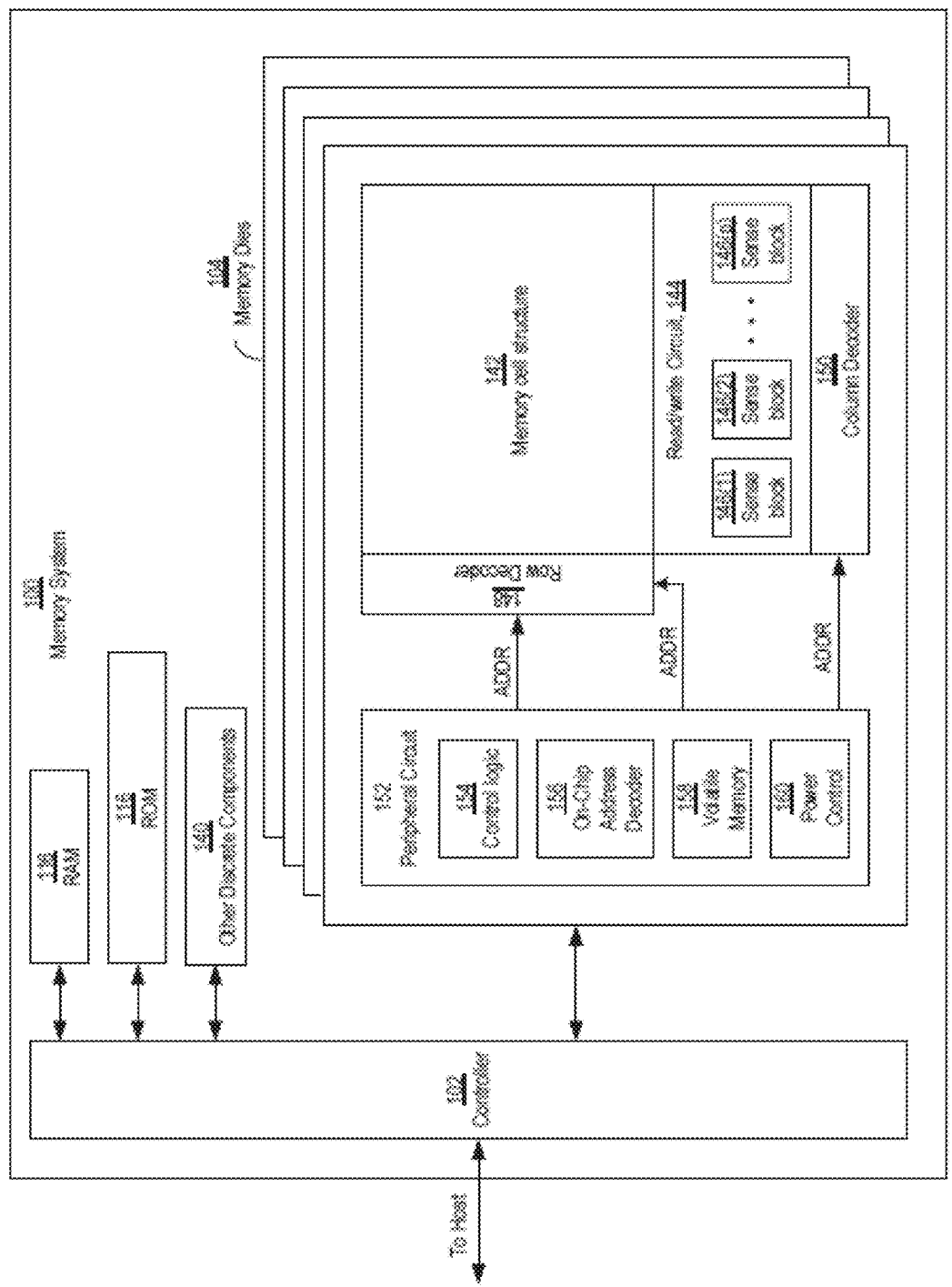
FIG. 2B is a block diagram of an example configuration of components of a memory die of the memory system of FIG. 1A.

FIG. 2B is a block diagram of a configuration of components of a memory die 104 of the memory system of FIG. 1A. The memory die 104 includes a memory cell structure 142 that includes a plurality of memory cells, interchangeably referred to as memory elements. A memory cell is an element or component that stores a unit of data having an n-bit data value, where n is on or more. Any suitable type of memory can be used for the memory cells of the memory cell structure 142. As examples, the memory may be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), or any other elements comprising semiconductor material or other material capable of storing information. Each type of memory may have a different configuration. For example, flash memory may be configured in a NAND or a NOR configuration.

The memory can be formed from passive and/or active elements, in any one or more combinations, as would be understood by one of skill in the art.

Multiple memory cells may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple cell groups, where the memory cells that are part of the same cell group share a single bias line, such as a single word line or a single bit line, and are accessed or biased as a group.

A plurality of memory cells that form the memory cell structure 142 of a memory die may be located within and/or over a substrate. The substrate may be a wafer over, in which the layer of the memory cells are formed, or it may be a carrier substrate, which is attached to the memory cells after they are formed.

Memory cells that form the memory cell structure 142, or at least a portion of the memory cell structure 142, may be arranged in two dimensions or in three dimensions in a two-dimensional (2D) of 3D memory cell structure.

In related art methods, BES or VS would be performed on a representative WL whenever a WL shows an elevation in BER. A WL on an edge of a block may be chosen as an indicative WL so that BER elevation is caught quickly. In a scenario in which temperatures shift during a long, sequential read, these events would trigger frequently, causing the system to suffer from reduced performance, as the frequent operation of BES would cause latency.

Figure 3:
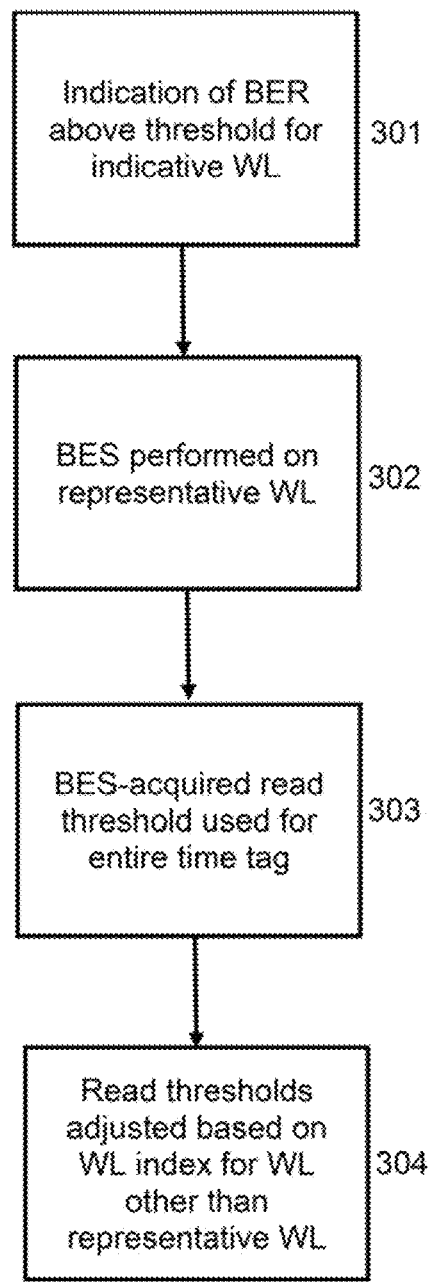
FIG. 3 is a flowchart of a related art method of read threshold calibration.

Such a related art method is shown, for example, in the flow chart of FIG. 3. As discussed above, this related art method is triggered by an indication that there is an elevation of BER for an indicative WL, which may be a WL on an edge of a block (301). For example, an elevation above a certain threshold, or alternately, an elevation of a certain amount from a previous BER, may trigger this series of read threshold calibration operations. The BES is then performed on the representative WL (302). The read threshold(s) acquired by the BES is then used for the remainder of the time tag (303), and may be adjusted for WL other than the representative WL, based on a WL index (304).

According to one or more example embodiments, read threshold determines and uses an adjustable rate for a long, sequential read in a scenario in which temperature may be rapidly shifting during the read. Small shifts in read thresholds (also referred to herein as "tracking") suit such a scenario.

In comparison to BES and VS, as discussed above, an approach called Read Level Tracking (RLT) involves performing a calibration not based on doing multiple reads, such as with VS and BES, but rather based on using the host reads themselves.

In implementation, a collection of memory cells programmed into a same memory state may have an associated collection of threshold voltage as a result of programming. The threshold voltages may be represented as a threshold voltage probability distribution, or just threshold distribution of the number of memory cell in the collection as a function of threshold voltage.

A given storage scheme may have a model, reference, ideal, or target threshold voltage distribution, which may be in the form of a continuous probability distribution, such as a Gaussian distribution, for example, for each of the memory states and associated threshold voltage ranges defined by the given storage scheme. A model threshold voltage distribution may represent a model of an ideal threshold voltage distribution for a collection of memory cells programmed into the same memory state. The lower and upper tails of the model threshold voltage distributions may align or correspond to the upper and lower threshold voltage levels of the ranges with which each of the model threshold voltage distributions is associated.

Figure 4A:
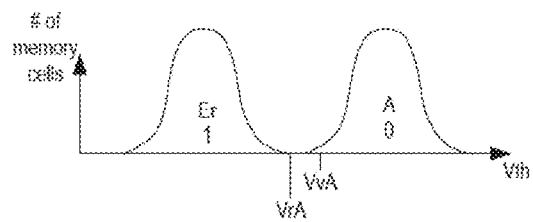
FIGS. 4A-4D are plots of threshold voltage distribution curves for different storage schemes.
Figure 4B:
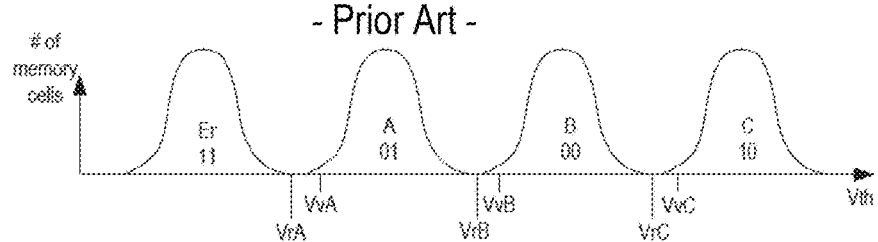
Figure 4C:
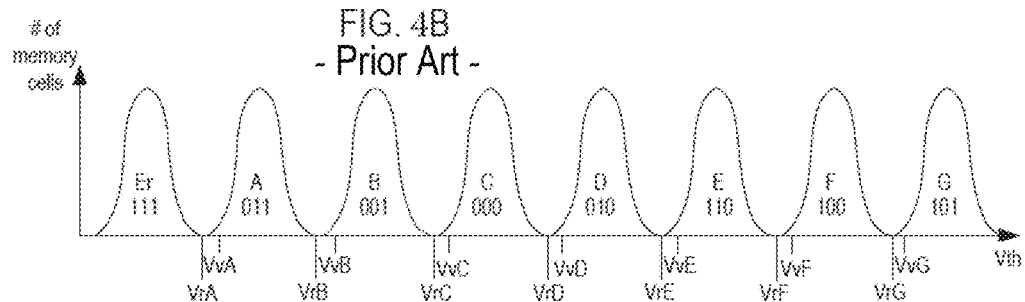
Figure 4D:
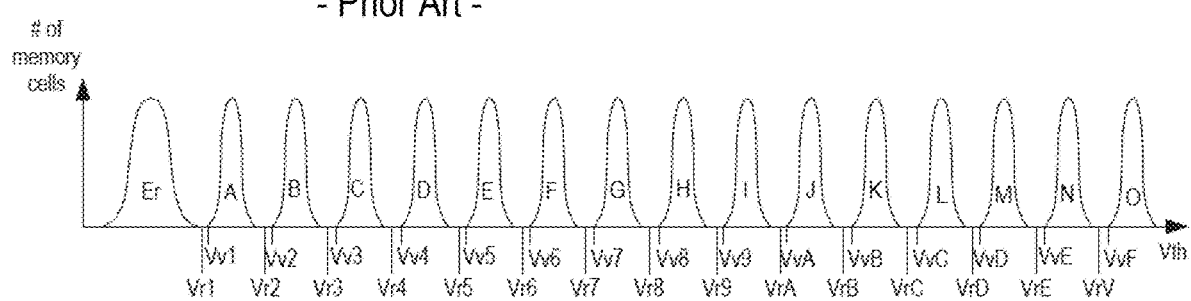

FIGS. 4A-4D are plots of threshold voltage distribution curves for different storage schemes for storing different numbers of bits of data into the memory cells. The threshold voltage distribution curves are plotted for numbers of memory cells as a function of threshold voltage Vth with each curve representing a unique data state associated with one or more bits of data. FIG. 4A illustrates threshold voltage distribution curves for an SLC storage scheme (one bit of data per memory cell); FIG. 4B illustrates the threshold voltage distribution curves for an MLC storage scheme (two bits of data per memory cell); FIG. 4C illustrates the threshold voltage distribution curves for a TLC storage scheme (three bits of data per memory cell); and FIG. 4D illustrates the threshold voltage distribution curves for a QLC storage scheme (four bits of data per memory cell). Similar threshold voltage distribution curves may be defined or generated for other storage schemes used for storing numbers of bits other than (such as more than) two, three, or four bits per memory cell With reference to FIG. 4A, for memory cells programmed according to the SLC storage scheme, the memory cells may be in either an erased state Er or a program state A. With reference to FIG. 4B, for memory cells programmed according to the MLC storage scheme, each memory cell may be in an erased state Er or one of three program states A, B, C. With reference to FIG. 4C, for memory cells programmed according to the TLC storage scheme, each memory cell may be in an erased state Er or one of seven program states A, B, C, D, E, F, G. With reference to FIG. 4D, for memory cells programmed according to the QLC storage scheme, each memory cell may be in an erased state Er or one of fifteen program states A, B, C, D, E, F, G, H, I, J, K, L, M, N, O. It is noted that the terms "memory state" and "program state" are used interchangeably herein. For example, the terms "memory state A" and "program state A" are used interchangeably to refer to the same memory state.

As illustrated in FIGS. 4A-4D, each program state is associated with a respective verify threshold voltage level (or verify threshold) Vv and a read voltage threshold level (or read threshold) Vr. For example, with respect to the storage schemes of FIGS. 4A-4D, a verify threshold VvA and a read threshold VrA are associated with memory state A, verify threshold VvB and read threshold VrB are associated with memory state B, and verify threshold VvC and read threshold VrC are associated with memory state C, and so on.

As illustrated in FIGS. 4A-4D, the verify and read thresholds Vv, Vr specify or are positioned relative to lower bounds or tails of the threshold voltage distribution curves. The verify thresholds Vv are used during programming to define when programming of a memory cell is completed, i.e., further programming of a memory cell is inhibited in response to the threshold voltage of that memory cell exceeding the verify threshold Vv of the data state the memory cell is being programmed to. The read thresholds Vr are used during a read operation to determine which data state a memory cell has been programmed to.

In addition, in FIGS. 4A-4C, example associated data values are included within or under each of the threshold voltage distribution curves for the memory states. For example, FIG. 4A illustrates an example embodiment in which the left threshold voltage distribution curve is associated with the erased state Er and a logic "1" value, and the right threshold voltage distribution curve is associated with memory state A and a logic "0" value. In the MLC and the TLC storage schemes depicted in FIGS. 4B and 4C, respectively, the data values sequentially change with increasing memory states and threshold voltage ranges. In various example embodiments, the specific data values associated with each data state may change according to a predetermined scheme, such as a Gray code scheme. With reference to FIG. 4B, memory cells programmed according to the MLC storage scheme store two bits per cell, with the erased state Er being associated with the data value "11"; the memory cells programmed to the memory state A being associated with the data value "01"; memory cells programmed to the memory state B being associated with the data value "00"; and memory cells programmed to the memory state C being associated with the data value "10." Similarly, with reference to FIG. 4C, memory cells programmed according to the TLC storage scheme store three bits per cell, with the erased erase state Er being associated with the data value "111"; memory state A being associated with the data value "011"; memory state B being associated with the data value "001"; memory state C being associated with the data value "000"; memory state D being associated with the data value "010"; memory state E being associated with the data value "110"; memory state F being associated with the data value "100"; and memory state G being associated with the data value "101." Similar relationships or correspondences between data values, memory states, and threshold voltage ranges can be made for memory cells programmed according to the QLC storage scheme (four bits per memory cell), as shown in FIG. 4D).

Referring back to FIG. 2B, the memory die 104 may further include a read/write circuit 144 that includes a plurality or a p-number of sense blocks (also referred to as sense modules or sense systems) 146. The sense blocks 146 are configured to participate in reading data from already programmed memory cells verifying memory cells during a programming operation.

The power control circuit 160 may include any of various circuit topologies or circuit configurations to generate and/or supply the voltages at appropriate levels to perform memory operations, (including read, program/write, sense, and erase operations), such as driver circuits, current sources, charge pumps, reference voltage generators, regulators, and pulse generation circuits, or any of various combinations thereof. Other types of circuits to generate the voltages may be possible. In addition, the power control circuit 160 may communicate with and/or be controlled by the control logic circuit 154, the read/write circuits 144, and/or the sense blocks 146 in order to supply the voltages at appropriate levels and at appropriate times to carry out the memory operations.

During read operations, the power control circuit 160 may bias word lines at read threshold voltage levels Vr in order to read the data values of the data that the memory cells are storing. A threshold voltage level Vr for a given memory state may have different optimum values for different operating conditions, including different process conditions, different program/erase cycles, different retention times, different temperatures, different disturb conditions, or combinations thereof. For a given storage scheme, the memory system, at the controller side, and/or at the memory die side, may maintain a data structure, such as a table, that identifies one or more sets of read threshold levels for the power control circuit 160 to use to bias the word lines during read operations. The data structure may include multiple sets of read threshold levels; each corresponding to a different area of the memory dies 104.

Figure 5:
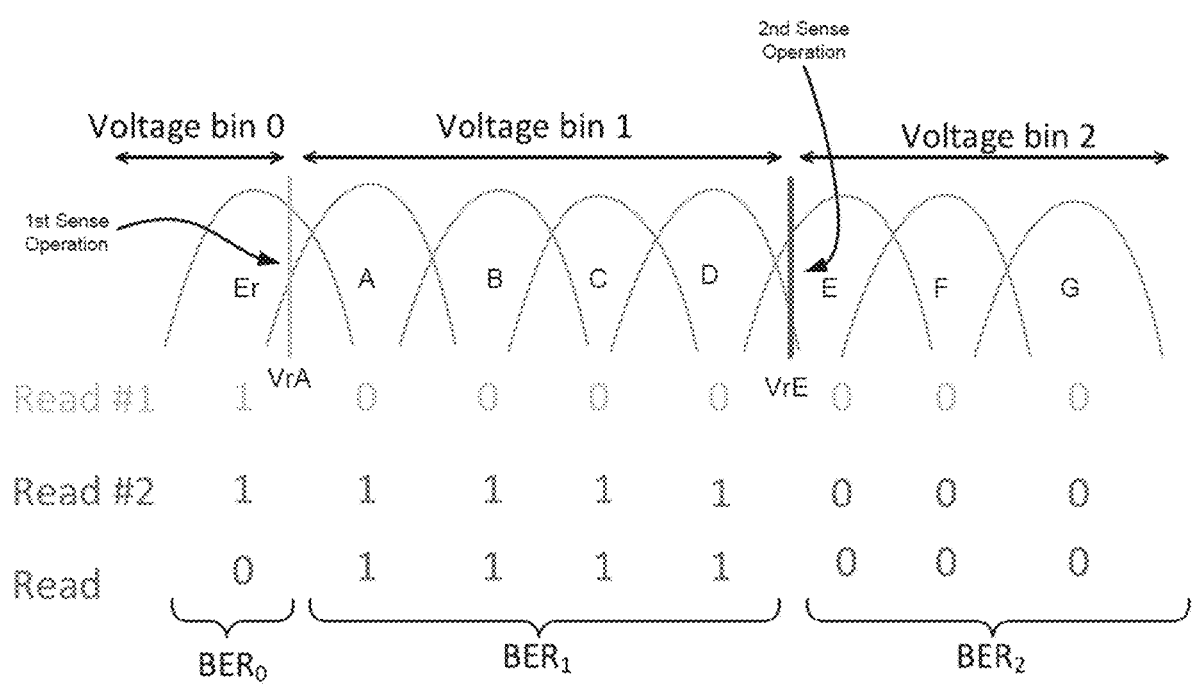
FIG. 5 is a diagram of multiple sense operations performed to read a lower page of data stored in three bits-per-cell MLC cells.

As illustrated in FIG. 5, when the first sense operation is performed, the sense circuits output a logic 1 for TLC cells in the erase state Er, and output a logic 0 for TLC cells in memory states A through G. When the second sense operation is performed, the sense circuits output a logic 1 for TLC cells in the erase state Er and memory states A through D, and output a logic 0 for TLC cells in memory states E through G. In various example embodiments, the read/write circuit 144 (or other circuitry on the memory die 104, such as the control logic 154, for example) may perform a NOT XOR (NXOR) operation between the logic bit values of the first sense operation and the logic bit values of the second sense operation, to generate the read bit values for the lower-page bits.

The ECC module 124 then decodes the read page in order to generate the decoded page. After the ECC module 124 decodes the read page, the controller 102 may be configured to calculate an error page by comparing (e.g., XORing) the read page and the decoded page. Then, based on the error page and the individual sensing result pages, the controller 102 may compute the number of errors Ej or the Bit Error Rate BERj for each voltage bin j, by counting each error in the error page (e.g., each bit within the error page which is equal to 1) in the corresponding voltage bin counter (e.g., as determined by the corresponding values of the individual sensing result pages).

For example, if, for a certain memory cell, the individual sensing results are 11 read value=NXOR(1,1)=1 and the decoded value is 0 (e.g., indicating an error), then the controller 102 increments the counter E0 (4 BER0) corresponding to voltage bin 0. If, for a certain memory cell, the individual sensing results are 01→read value=NXOR(0,1)=0 and the decoded value is 1 (indicating an error), then the controller 102 increments the counter E1 (4 BER1) corresponding to voltage bin 1. If, for a certain memory cell, the individual sensing results are 00→read value=NXOR(0,0)=1 and the decoded value is 0 (indicating an error), then the controller 102 increments the counter E2 (4 BER2) corresponding to voltage bin 2.

The read/write circuit may perform sense operations in a similar manner to read the middle page and the upper page in order to complete execution of the read operation. For each of the middle page and the upper page, the number of sense operations performed may be different and/or the read threshold voltage levels applied to the bit lines may be different. In one example TLC (three bits per cell) storage scheme, the sense circuits perform three sense operations to read a middle page, and two sense operations to read an upper page. However, the decoding operation is generally the same—for a given middle stage or upper stage, the read/write circuit 144 may perform NXOR operations on the bit values determined from the multiple sense operations to generate a read middle page and a read upper page.

Figure 6A:
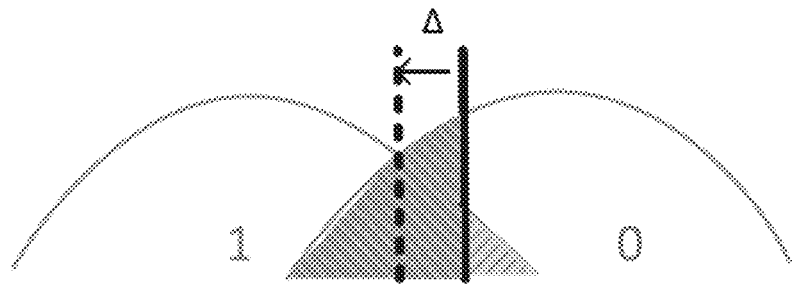
FIGS. 6A and 6B illustrate decreasing and increasing read threshold levels, respectively, for SLC.
Figure 6B:
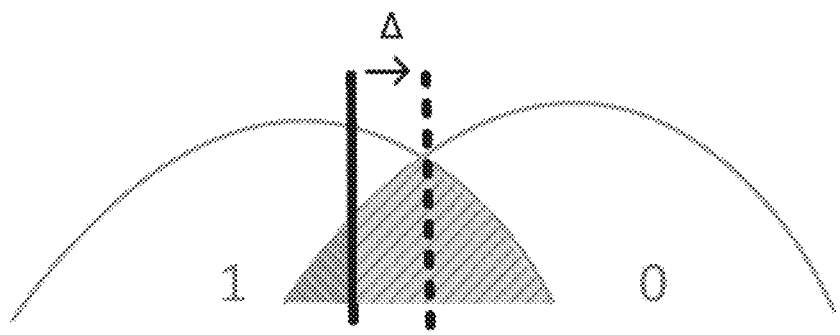

As mentioned, the controller 102 determines how to adjust or revise read threshold voltage levels based the BER of read pages of data. For example, as shown in FIGS. 6A and 6B, if $BER_{1\rightarrow 0}$ and $BER_{0\rightarrow 1}$ are known, then the location where the read threshold should be located may be determined, assuming a Gaussian state distribution. As shown in FIG. 6A, if $BER_{1\rightarrow 0}>BER_{0\rightarrow 1}$, the read threshold is moved left; and, as shown in FIG. 6B, if $BER_{1\rightarrow 0}\leq BER_{0\rightarrow 1}$, the read threshold is moved right.

Adjusting read threshold levels based on BER for MLC storage schemes involving multiple sense operations to read a single page (e.g., lower, middle, upper, etc.) becomes more complicated since a single comparison between two counts cannot be performed. For example, referring back to FIG. 5, when reading a lower page in a TLC (three bits per cell) storage scheme, when a decoder flips a bit value from logic 0 to logic 1, the decoder does not know, without more information, whether the flip corresponds to the A read threshold level VrA or the E read threshold level.

In order to gain more information, the controller 102 divides the threshold voltage range into voltage bins defined by the read threshold levels, and determines BERs for the different voltage bins. Additionally, or alternately, the controller 102 receives the lower page bits from both the first and the second sense operations before the NXOR operation is performed, so the controller 102 can determine the voltage bin to which each bit belongs. By knowing the voltage bins to which each bit belongs, the controller 102 can then update accurate counts to adjust the BERs, and in turn the threshold voltage level adjustments accordingly.

To illustrate, as indicated in FIG. 5, the A and E threshold voltage levels used for the first and second sense operations divide the threshold voltage distribution curves into three voltage bins. Voltage bin 0 includes the erase state Er voltage distribution curve. Voltage bin 1 includes the voltage distribution curves for memory states A through D. Voltage bin 2 includes voltage distribution curves for memory states E through G.

To determine the voltage bins, the controller 102 receives the lower page bits from both the first and second sense operations, instead of (or in addition to) a read lower page bits based on an NXOR operation in order to differentiate bits in Voltage bin 0 from Voltage bin 2. For example, for a given bit, if the combined bit value indicated from the first and second sense operations is "11" then the controller 102 knows that given bit is in Voltage bin 0. On the other hand, for a given bit, if the combined bit value indicated from the first and second sense operations is "00" then the controller 102 knows that the given bit is in Voltage bin 2.

After identifying the voltage bins for each of the lower page bits, the controller 102 may then perform the NXOR operation to generate the read lower page. The controller 102 may then perform error correction via the ECC module 124 by flipping bit values of bits. Based on the decoding results and the individual sensing pages, the controller 102 may compute three BER counts, a first count for Voltage bin 0, a second count for Voltage bin 1, and a third count for Voltage bin 2. The first count may indicate a BER0 associated with Voltage bin 0, the second count may indicate a BER1 associated with Voltage bin 1, and the third count may indicate a BER2 associated with Voltage bin 2.

When the ECC module 124 determines to change a bit having a logic 0 to a logic 1, the controller 102 may determine whether the bit is in Voltage bin 0 or Voltage bin 2. If the bit is in Voltage bin 0, then the controller 102 may update the first count. If the bit is in Voltage bin 2, then the controller 102 may update the third count. Additionally, or alternatively, if the ECC module 124 determines to change a bit having a logic 1 to a logic 0, then the controller 102 may update the second count associated with Voltage bin 1.

Figure 7:
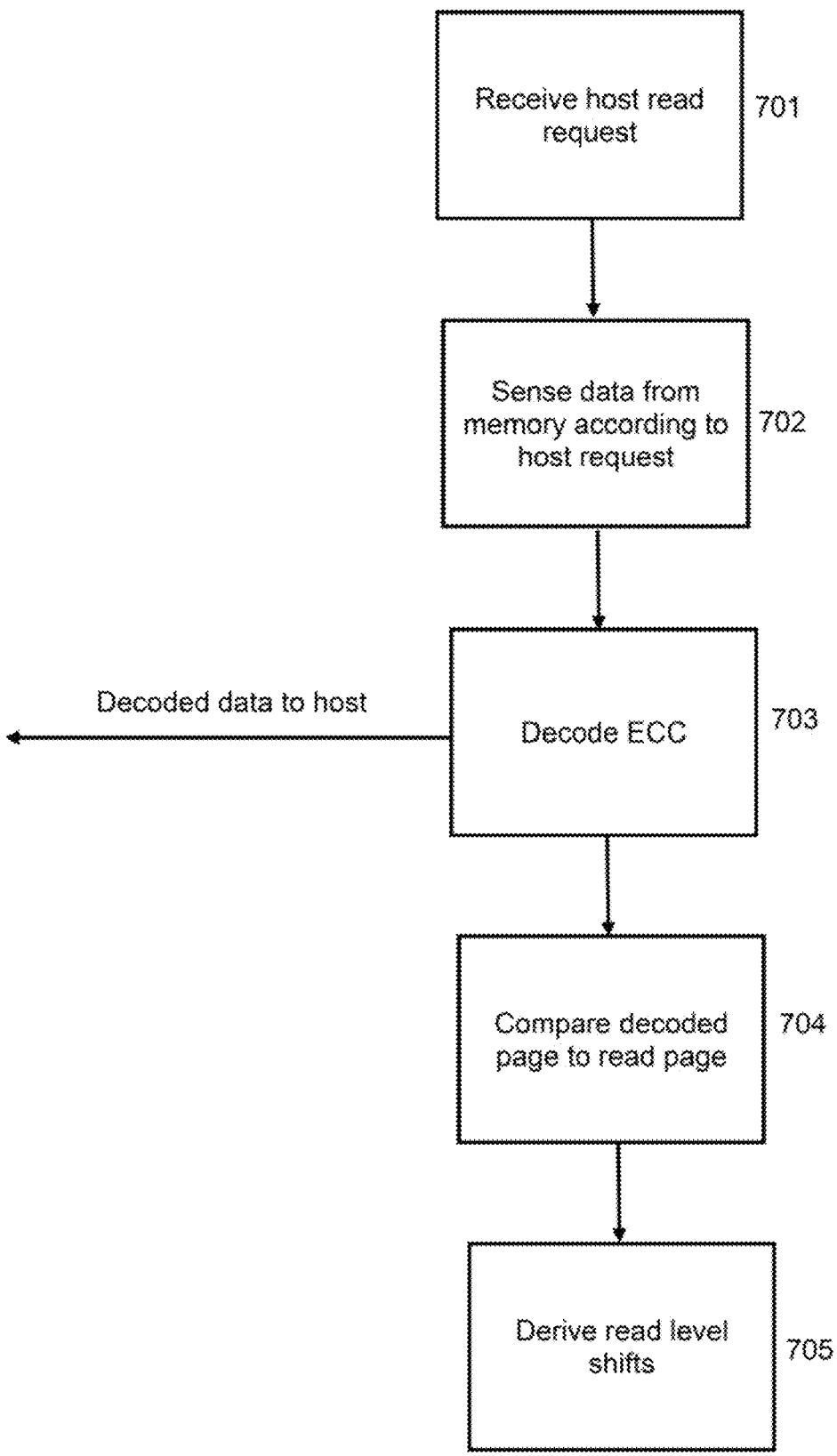
FIG. 7 is a flowchart of a read threshold calibration method according to an example embodiment.

FIG. 7 is a flowchart of a continuous RLT method according to an example embodiment. As shown in FIG. 7, for example, a host may be trying to read a page but the threshold levels are off. When a host read request is received (701), data is sensed from memory based on the host request (702). The code is then decoded using ECC, and the decoded data is appropriately sent to the host (703). Assuming that the code was successfully decoded, differences between the decoded page and the corresponding read page can be observed (704) to determine where the error is coming from. Then, it can be determined where/how to move the read threshold (705).

Figure 8:
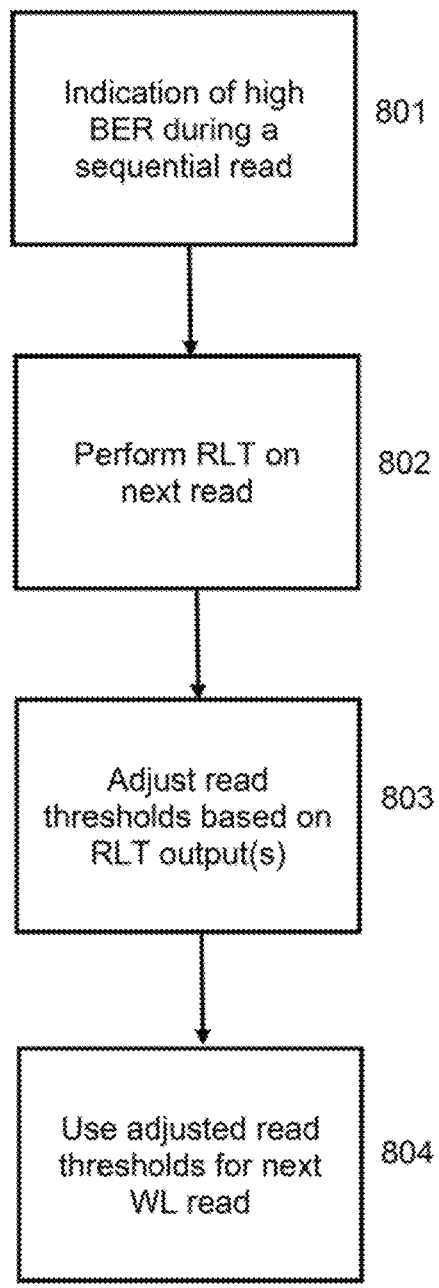
FIG. 8 is a flowchart of a read threshold calibration method according to another example embodiment.

FIG. 8 is a flowchart of a read threshold calibration method according to an example embodiment. According to this example embodiment, continuous RLT is used based on an adjustable rate during a long, sequential read scenario in which there are temperature shifts which may be rapid. The example method is based on an understanding that small shifts in the read thresholds which are performed often (also referred to herein as "tracking") may provide an improved read threshold calibration over one which is performed less frequently or only upon an indication of a high BER.

According to this example method, when there is an indication of a BER higher than a predetermined threshold (801), an RLT is performed on the next WL to be read (802). As with the RLT discussed above, this RLT does not interfere with the host reads. The read thresholds are then calibrated based on the difference between the decoded page and the corresponding read page (803). These read thresholds are then used for the next WL to be read (804).

Figure 9:
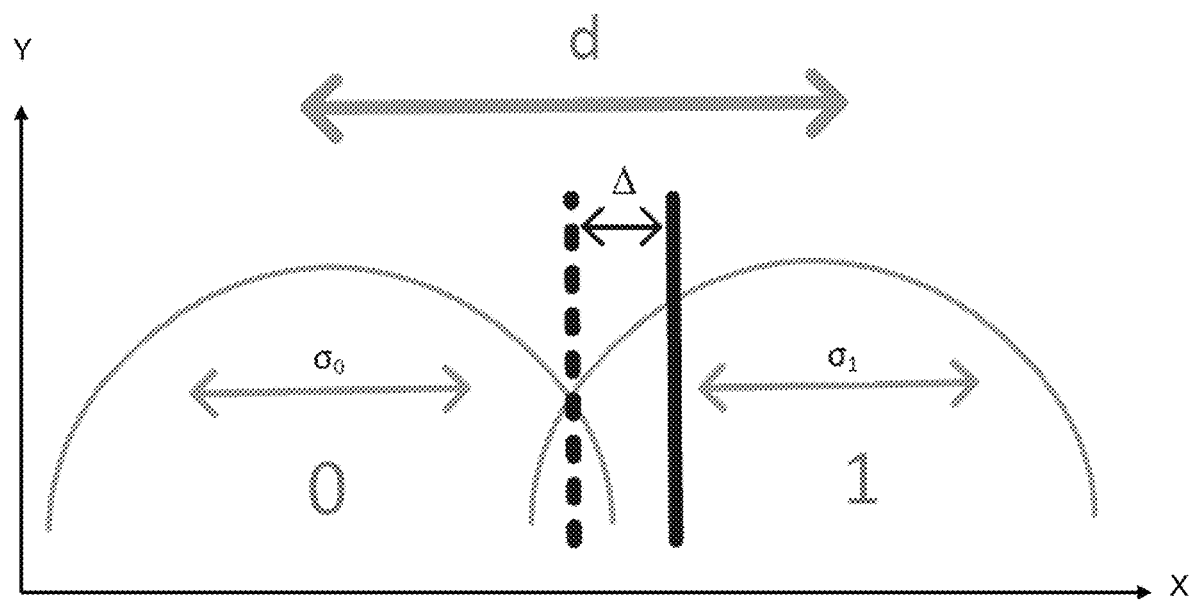
FIG. 9 is an illustrate of how a change in read threshold may be determined with respect to a single read threshold voltage.

FIG. 9 illustrates how Δ may be created when BER is known after a successful decode (or error correction). This example method can be used to calibrate read thresholds after a successful ECC decode, when the BER of each voltage bin can be derived from calculating the number of FBC in each voltage bin. Each of the bits is mapped to its voltage bin according to the results of the single threshold reads, the bits that are in error are summed per voltage bin, and the error vector is passed to the module that calculates the read thresholds according to the BER per voltage bin.

FIG. 9 zooms in on a single threshold. In FIG. 9, d is the distance between the centers of 2 states, $\sigma 0$ and $\sigma 1$ are the standard deviations of the corresponding states. Δ here is distances of the current read threshold (solid) from the optimal read threshold (dashed). N is the number of cells in a page, and N/8 is the total number of cells that are programmed in each data state, assuming scrambling. Since the decoding was successful, the number of cells in each data state may also be counted explicitly. E0 and E1 are the number of bits in error in each of the bins, so that P0 and P1 are the BER in each of the voltage bins.

Using the Gaussian tail distribution function Q, it can be derived that $$P_0 = Q\left(\frac{d/2 - \Delta}{\sigma_0}\right) = > d/2 - \Delta = \sigma_0 \cdot Q^{-1}(P_0)$$

$$P_1 = Q\left(\frac{d/2 - \Delta}{\sigma_1}\right) = > d/2 - \Delta = \sigma_1 \cdot Q^{-1}(P_1)$$

Separating Δ, we get $$\Delta = \frac{\sigma_1 \cdot Q^{-1}(P_1) - \sigma_0 \cdot Q^{-1}(P_0)}{2}$$

To simplify the computation, one may assume that $\sigma_1 = \sigma_0 = \sigma$.

$$\Delta = \frac{\sigma(Q^{-1}(P_1) - Q^{-1}(P_0))}{2} > \frac{\sigma_{min}(Q^{-1}(P_1) - Q^{-1}(P_0))}{2}$$

In the above expressions, $\sigma_{min}$ is assumed such that $\sigma_{min} < \sigma_1$ and $\sigma_{min} < \sigma_0$ both. This can be derived offline and modified during the lifetime of the device as σ is expected to grow higher with the PEC. However, the exact knowledge of σ is not required at this stage, as it is a positive number, and will only effect the amplitude of Δ rather than its sign.

For a single threshold, the above expression provides a calculation of Δ, which can be used to successfully tune the read thresholds of an SLC page given the error rates in the voltage bins. However, for MLC, TLC, or QLC, several thresholds are involved when reading a single page. From an example of TLC LP on FIG. 5, BER #1 and BER #3 are computed exactly, but BER #2 is split between the two thresholds that constitute LP read.

According to this example embodiment, any RLT overhead is a result of extra transfers from memory and additional processing, both of which are on the order of single micro seconds. In contrast a BES operation incurs at least five (5) read operations, which, in a QLC, is about three hundred micro seconds (300 μs) of overhead, even before processing is taken into account. BES also requires stopping the read operation pipeline and inserting the BES operation or stalling the BES operation, which would result in the longer use of inferior read thresholds. In contrast according to this example embodiment, the RT of the representative WL is optimized, or alternately, the current WL can be used as a reference.

Figure 10:
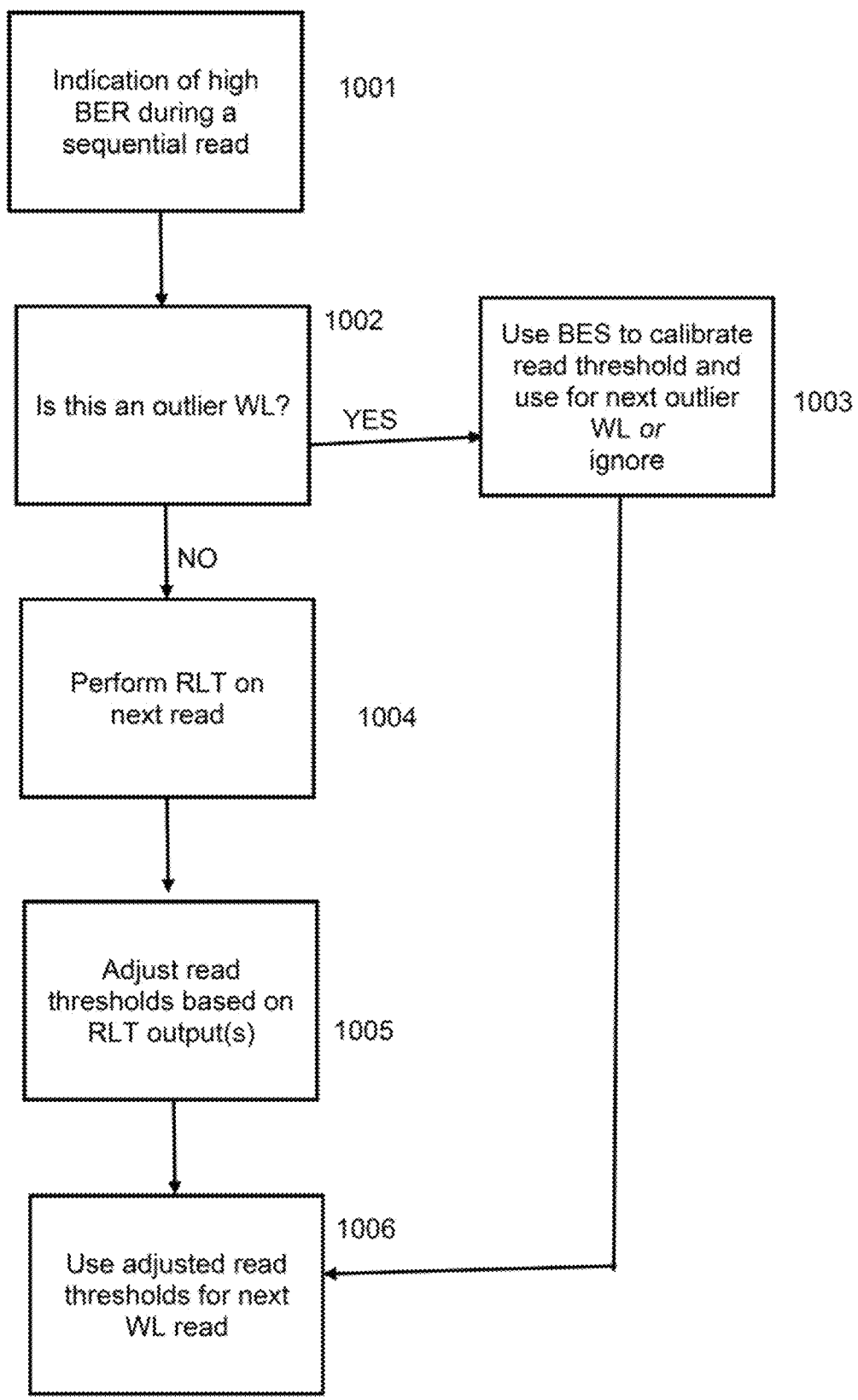
FIG. 10 is a flowchart of a read threshold calibration method according to another example embodiment.

FIG. 10 is a flowchart of a read threshold calibration method according to another example embodiment. A block of flash memory includes many word lines, not all of which are equal. For example, the read threshold of an outliner WL, such as an edge WL, may be significantly different than that of other, e.g. "center," WLs. For example, in one type of block that has ninety-six (96) WLs arranged in two "hemispheres" with a middle of the block also being considered to be an "edge," the edge/outlier WL may be WLs 0, 1, 46, 47, 48, 49, 94, and 95. Each memory type has its own specifications regarding this hard-coded outlier indication. The definition of an outlier WL may also come from another source if a certain WL is recognized as having some physical defect, for example, or if there is another reason which may render the WL an outlier with respect to the block.

Therefore, according to this example embodiment, these outlier WL are taken into account to prevent any miscalculations based on an incorrect assumption that an outlier WL has the same read threshold as a "center" WL. According to this example embodiment, outliner WL are treated differently, either by using BES on them in the case of a high BER, or by ignoring a high BER indication, assuming that the decoding is successful.

According to this example method, when there is an indication of a BER higher than a predetermined threshold (1001), a determination is made as to whether the WL in question is an outlier WL such as an edge WL (1002). If the WL is an outlier, then a BES operation can be performed on the WL or the high BER of that WL can be ignored (1003). For example, if it is first determined that there is a BER higher than a first threshold (1001), and the WL in question is an outlier (1002-YES), there may be an additional determination of whether the BER is higher than a second threshold, higher from the first threshold. If the BER is also higher than the second threshold, it may be determined to perform a BES operation, and if the BER is not higher than the second threshold, it may be determined to ignore the outlier WL.

If the WL in question is not an outlier WL (1002-NO), the method may continue as discussed above with respect to FIG. 7, i.e., an RLT is performed on the next read (1004); the read thresholds are adjusted based on the RLT output (1005); and the adjusted read thresholds are used for the next WL to be read (1006).

Figure 11:
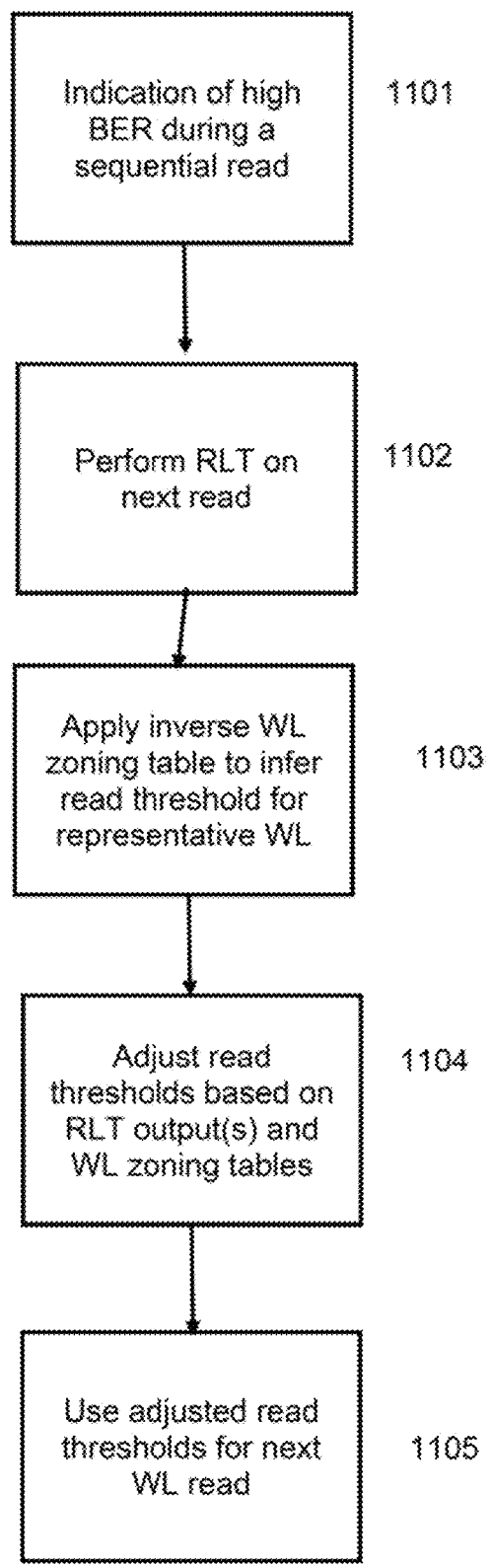
FIG. 11 is a flowchart of a read threshold calibration method according to another example embodiment.

FIG. 11 is a flowchart of a read threshold calibration method according to another example embodiment. According to this example embodiment, in order to account for WL variation, the WLs of a block can be divided into zones, and a WL zoning table can be used to modify RLT results and adjust them to apply to other WL.

According to this example embodiment, when there is an indication of a BER higher than a predetermined threshold (1101), RLT is performed on the next WL to be read (1102). An inverse WL zoning table is used to infer the read threshold for the representative WL (1103); the read thresholds are adjusted based on the RLT output and the WL zoning tables (1104); and the adjusted read thresholds are used for the next WL to be read (1105).

Figure 12:
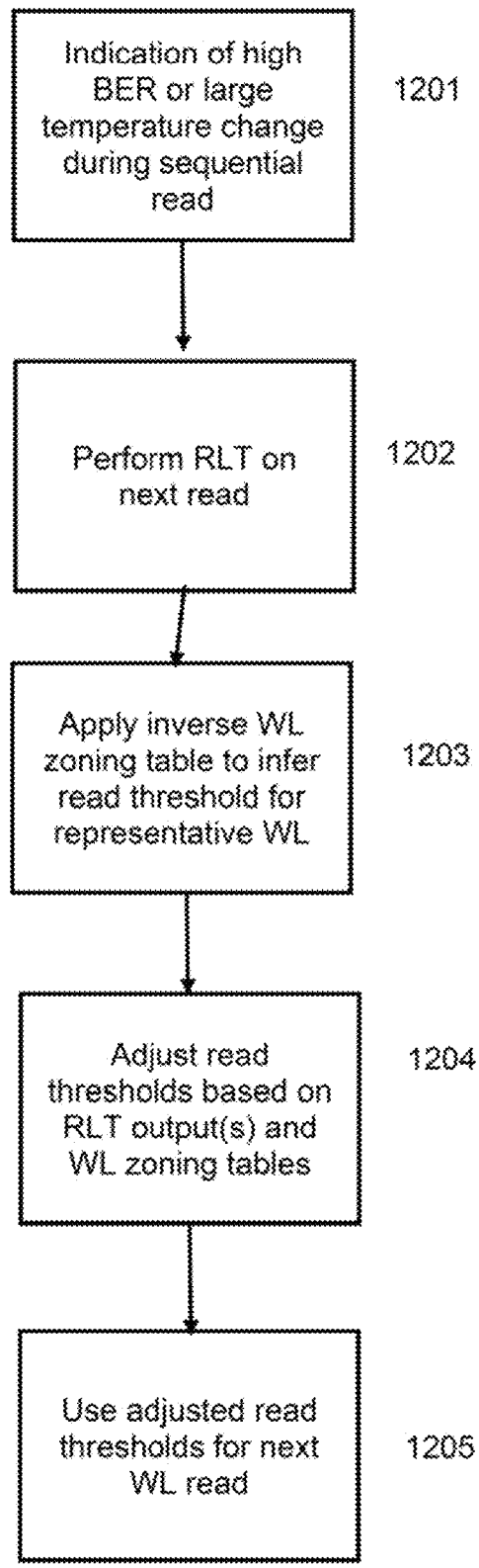
FIG. 12 is a flowchart of a read threshold calibration method according to another example embodiment.

FIG. 12 is a flowchart of a read threshold calibration method according to another example embodiment. In contrast to the example methods described above, according to this example embodiment the trigger for performing RLT may be based on a temperature change itself, with respect to a previous RLT operation, rather than on a high BER indication. Accordingly, this example method may permit improved adjustment of read thresholds before there is any actual elevation in the BER.

According to this example embodiment, the trigger for RLT may be a temperature change, with respect to a previous RLT operation, being higher than a temperature change threshold (1201). Alternately, the trigger may be one or more of a temperature change above a temperature change threshold and a BER higher than a predetermined threshold (1201). The other operations (1202-1205) of this example method are analogous to those (1102-1105) of the previous example embodiment described with respect to FIG. 11. Alternately, a temperature change based trigger may be combined with any one or more of the example embodiments discussed herein.

Figure 13:
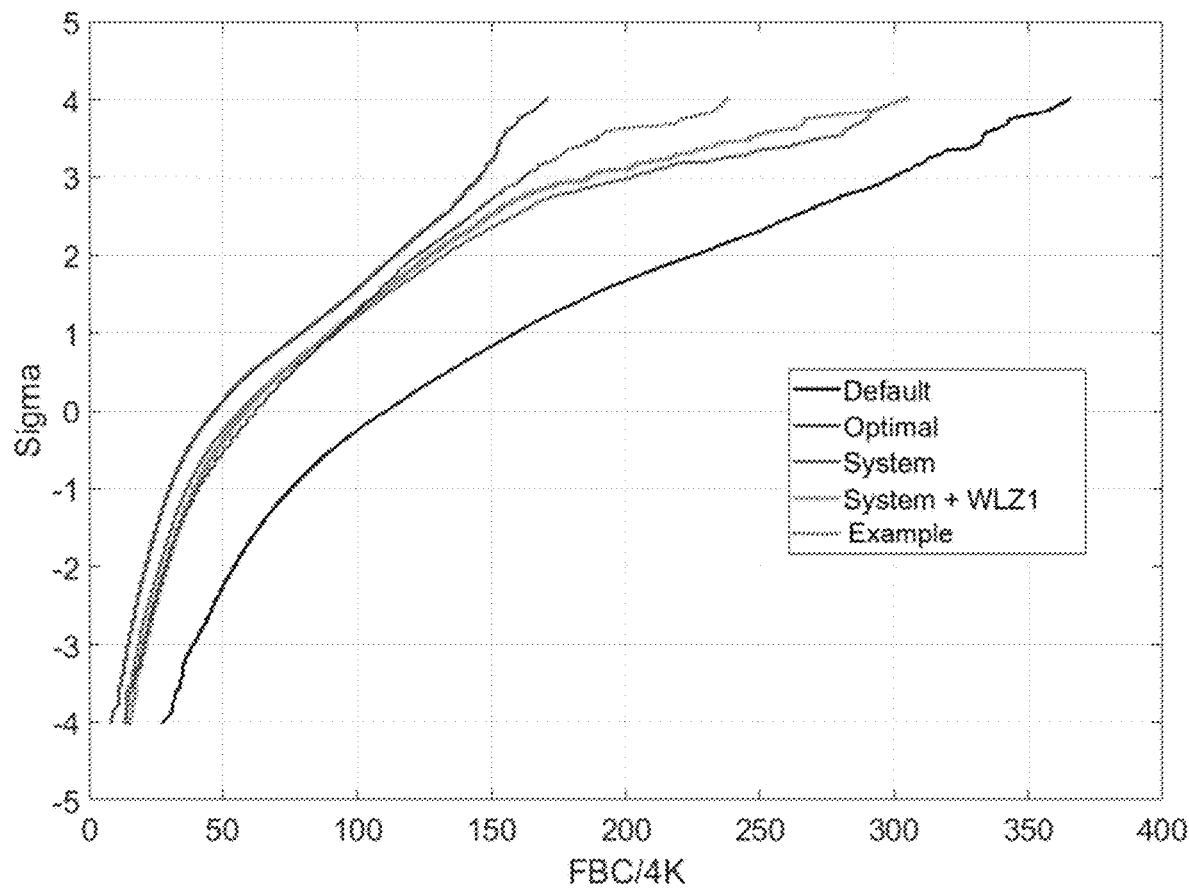
FIG. 13 illustrates example results of a read threshold calibration method according to one or more example embodiments.

FIG. 13 illustrates example results of a read threshold calibration method according to one or more of the example embodiments described herein. This example is based on the middle page of a BiCS5X3, in which the data is programmed at −25° C. and read in increasing temperatures up to 65° C.

The curve labeled "Optimal" shows the fail bit count (FBC) reading with optimal read thresholds, while the curve labeled "Default" shows the FBC reading with the default read thresholds. The curves labeled "System" and "System+ WLZ1" show the FBC reading with the read thresholds determined based on a related art method, and based on a related-art method using a WL zoning function that adds an offset on the representative WL read threshold for each different WL. The curve labeled "Example" shows the FBC reading according to one of the example embodiments described herein. It is evident that the read techniques described herein yields lower FBC figures, resulting in improved read performance.

Another factor that influences read performance is the number of calibration operations performed. While a BES operation is a comparatively long operation, taking between five and seven extra reads from the memory, an RLT operation is relatively short, does not require any extra reads, and only requires a limited number of extra transfers. For example, if the overhead of a BES operations is around three hundred micro seconds, the overhead of an RLT operation may be around twenty micro seconds (20 μs). Table #1, below, shows the number of operations for each of the methods performed for the graph of FIG. 10, showing the number of operations and number of operations per read page for each of a related art system without the use of WL zoning, a related art system using WL zoning, and a system according to one of the example embodiments described herein:

TABLE #1

Number of operations for each method during test

|  | Related Art w/o WLZ | Related Art + WLZ | Example |
|---|---|---|---|
| Number of operations | 624 | 583 | 524 |
| Operations per read page | 0.0233 | 0.0218 | 0.0196 |

As is evident from the table, the number of operations is significantly smaller for an example embodiment described herein, providing latency savings from overhead reduction.

According to an aspect of an example embodiment as described herein, a method of calibrating read threshold voltages comprises: performing a plurality of read operations; determining to perform a read level tracking (RLT) method; and performing the RLT method comprising: determining a bit error rate (BER) of an indicative word line (WL); determining an adjusted read threshold level based on the BER; and adjusting read threshold levels according to the adjusted read threshold level. The determining to perform the RLT method may comprise determining that the BER of an indicative WL is above a BER threshold. The determining to perform the RLT method may further comprise determining that an indicative WL is not an outlier WL. An outlier WL may be an edge WL. The determining to perform the RLT method may comprise determining that a temperature change with respect to a previous RLT method is above a temperature threshold. The determining to perform the RLT method may comprise determining at least one of: a BER of an indicative WL is above a BER threshold, and a temperature change with respect to a previous RLT method is above a temperature threshold. The determining the BER may comprise: determining a plurality of voltage bins, for each of the plurality of voltage bins, determining a BER; and the determining the adjusted read threshold level based on the BER comprises: for each of the plurality of voltage bins, calculating a Gaussian tail distribution function based on a corresponding BER, and determining a distance of a read threshold from an optimal read threshold for each of the plurality of voltage bins. The determining the plurality of voltage bins may comprise, for each memory state resulting from the plurality of read operations, determining a corresponding voltage bin. The determining the BER may comprise estimating the BER using a corresponding syndrome weight. The performing the plurality of read operations may comprise performing the plurality of read operations according to a host request. The determining an adjusted read threshold level based on the BER may comprise applying a WL zoning table.

Various terms are used to refer to particular system components. Different companies may refer to a component by different names—this document does not intend to distinguish between components that differ in name but not function.

Matters of these example embodiments that are obvious to those of ordinary skill in the technical field to which these example embodiments pertain may not be described here in detail.

The example embodiments described herein may be considered in a descriptive sense only and not for purposes of limitation. Descriptions of features or aspects within each example embodiment may be considered as available for other similar features or aspects in other example embodiments.

While example embodiments have been described with reference to the figures, it will be understood by those of ordinary skill in the art that various changes in form and details may be made therein without departing from the spirit and scope as defined by the following claims.

What is claimed is:

1. A method of calibrating read threshold voltages during a sequential read operation, the method comprising:
   performing a plurality of sequential read operations;
   determining, subsequent to a first read operation of a first word line (WL), whether to perform a read level tracking (RLT) operation based on a comparison between a bit error rate (BER) of the first WL and a predetermined threshold;
   in response to a determination that the BER of the first WL is greater than the predetermined threshold, performing the RLT operation during a second read operation performed on a second WL;
   determining an adjusted read threshold level based on results of the RLT operation performed during the second read operation on the second WL;
   adjusting, for read operations performed subsequent to the second read operation, read threshold levels according to the adjusted read threshold level; and
   performing at least one read operation subsequent to the second read operation according to the adjusted read threshold level.

2. The method according to claim 1, wherein determining whether to perform the RLT operation further comprises determining whether the first WL is an outlier WL.

3. The method according to 2, wherein the outlier WL is an edge WL.

4. The method according to claim 1, wherein determining whether to perform the RLT operation comprises determining whether a temperature change with respect to a previous RLT operation is above a temperature threshold.

5. The method according to claim 1, further comprising:
   determining the BER by:
      determining a plurality of voltage bins,
      for each of the plurality of voltage bins, determining a corresponding BER; and
   determining the adjusted read threshold level by:
      for each of the plurality of voltage bins, calculating a Gaussian tail distribution function based on the corresponding BER, and
      determining a distance of a read threshold from an optimal read threshold for each of the plurality of voltage bins.

6. The method according to claim 5, wherein determining the plurality of voltage bins comprises, for each memory state resulting from the plurality of sequential read operations, determining a corresponding voltage bin.

7. The method according to claim 1, wherein determining the BER comprises estimating the BER using a corresponding syndrome weight.

8. The method according to claim 1, wherein performing the plurality of sequential read operations comprises performing the plurality of sequential read operations according to a host request.

9. The method according to claim 1, wherein determining an adjusted read threshold level based on the results of the RLT operation comprises applying a WL zoning table.

10. A system for calibrating read threshold voltages during a sequential read operation, the system comprising a controller in operative communication with at least one memory die, the controller comprising:

an interface configured to receive, from the at least one memory die, a number of bits corresponding to a plurality of sequential read operations; and a processor configured to:

determine, subsequent to a first read operation of a first word line (WL), whether to perform a read level tracking (RLT) operation based on a comparison between a bit error rate (BER) of the first WL and a predetermined threshold;

in response to a determination that the BER of the first WL is greater than the predetermined threshold, perform the RLT operation during a second read operation performed on a second WL;

determine an adjusted read threshold based on results of the RLT operation performed during the second read operation on the second WL;

adjust, for read operations performed subsequent to the second read operation, read threshold levels according to the adjusted read threshold level; and perform at least one read operation subsequent to the second read operation according to the adjusted read threshold level.

11. The system according to claim 10, wherein the processor is configured to determine whether to perform the RLT operation by determining whether the first WL is an outlier WL.

12. The system according to claim 11, wherein the outlier WL is an edge WL.

13. The system according to claim 10, wherein the processor is configured to determine whether perform the RLT operation by determining whether a temperature change with respect to a previous RLT method is above a temperature threshold.

14. The system according to claim 10, wherein:

to determine the BER, the processor is configured to:

determine a plurality of voltage bins, for each of the plurality of voltage bins, determine a corresponding BER; and to determine the adjusted read threshold level, the processor is configured to:

for each of the plurality of voltage bins, calculate a Gaussian tail distribution function based on the corresponding BER, and determine a distance of a read threshold from an optimal read threshold for each of the plurality of voltage bins.

15. A system for calibrating read threshold values during a sequential read operation, the system comprising a control means in operative communication with at least one memory die, the control means comprising:

an interface means configured to receive, from the at least one memory die, a number of bits corresponding to a plurality of sequential read operations; and processing means configured to:

determine, subsequent to a first read operation of a first word line (WL), whether to perform a read level tracking (RLT) operation based on a comparison between a bit error rate (BER) of the first WL and a predetermined threshold;

in response to a determination that the BER of the first WL is greater than the predetermined threshold, perform the RLT operation during a second read operation performed on a second WL;

determine an adjusted read threshold based on results of the RLT operation performed during the second read operation on the second WL;

adjust, for read operations performed subsequent to the second read operation, read threshold levels according to the adjusted read threshold level; and perform at least one read operation subsequent to the second read operation using the adjusted read threshold level.

* * * * *